United States Patent
Honda et al.

(10) Patent No.: US 7,749,868 B2
(45) Date of Patent: Jul. 6, 2010

(54) PROCESS OF FORMING A CURVED PROFILE ON A SEMICONDUCTOR SUBSTRATE

(75) Inventors: Yoshiaki Honda, Kadoma (JP); Takayuki Nishikawa, Kadoma (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 218 days.

(21) Appl. No.: 11/920,544

(22) PCT Filed: May 16, 2006

(86) PCT No.: PCT/JP2006/310098

§ 371 (c)(1),
(2), (4) Date: Nov. 16, 2007

(87) PCT Pub. No.: WO2006/123815

PCT Pub. Date: Nov. 23, 2006

(65) Prior Publication Data

US 2009/0104753 A1    Apr. 23, 2009

(30) Foreign Application Priority Data

| May 18, 2005 | (JP) | 2005-145952 |
| Dec. 22, 2005 | (JP) | 2005-371071 |
| Dec. 22, 2005 | (JP) | 2005-371072 |
| Jan. 26, 2006 | (JP) | 2006-018194 |

(51) Int. Cl.
H01L 21/479 (2006.01)

(52) U.S. Cl. .................. 438/466; 438/10; 438/770; 438/745; 438/441; 438/758; 257/E21.211; 257/E21.214; 257/E21.219; 257/E21.288

(58) Field of Classification Search ............... 438/466, 438/10, 770, 745, 441, 758; 257/E21.211, 257/E21.214, E21.219, E21.288
See application file for complete search history.

(56) References Cited

U.S. PATENT DOCUMENTS 5,565,084 A    10/1996    Lee et al.

(Continued)

FOREIGN PATENT DOCUMENTS

GB         1 530 509        11/1978

(Continued)

OTHER PUBLICATIONS

Japanese Official Action dated Jan. 23, 2007 issued in JP2006-139419.

(Continued)

*Primary Examiner*—Matthew Smith
*Assistant Examiner*—Wilner Jean Baptiste
(74) *Attorney, Agent, or Firm*—Edwards Angell Palmer & Dodge LLP

(57) ABSTRACT

A semiconductor substrate shaped to have a curved surface profile by anodization. Prior to being anodized, the substrate is finished with an anode pattern on its bottom surface so as to be consolidated into a unitary structure in which the anode pattern is precisely reproduced on the substrate. The anodization utilizes an electrolytic solution which etches out an oxidized portion as soon as it is formed as a result of the anodization, to thereby develop a porous layer in a pattern in match with the anode pattern. The anode pattern brings about an in-plane distribution of varying electric field intensity by which the porous layer develops into a shape complementary to a desired surface profile. Upon completion of the anodization, the curves surface is revealed on the surface of the substrate by etching out the porous layer and the anode pattern from the substrate.

9 Claims, 10 Drawing Sheets

U.S. PATENT DOCUMENTS 6,815,315 B2 * 11/2004 Watabe et al. ............... 438/466
7,521,097 B2 *  4/2009 Horne et al. ................ 427/585

FOREIGN PATENT DOCUMENTS

| JP | 52-004785 | 1/1977 |
|----|-----------|--------|
| JP | 55-013960 | 1/1980 |
| JP | 62-172731 | 7/1987 |
| JP | 05-109691 | 4/1993 |
| JP | 10-079524 | 3/1998 |
| JP | 2000-263556 | 9/2000 |

OTHER PUBLICATIONS

European Official Communication dated Jun. 15, 2009 issued in EP 06 746 682.1.

International Search Report for PCT Application No./ PCT/JP2006/310098, mailed Aug. 24, 2006.

Mescheder, U.M., et al.: "3D Structuring of c-Si Using Porous Silicon as Sacrificial Matrial", Nanotechnology, IEEE-Nano 2002, Aug. 26, 2002, pp. 33-36.

* cited by examiner

PROCESS OF FORMING A CURVED PROFILE ON A SEMICONDUCTOR SUBSTRATE

BACKGROUND OF THE INVENTION

1. Field of the Invention

The present invention is directed to a process of forming a curved profile on a semiconductor device, particularly by anodization of the substrate.

2. Description of the Related Art

One prior art is disclosed in Japanese patent publication No. 55-13960 which is directed to a process of making a micro structure in the surface of a semiconductor substrate by anodization. The anodization is used for oxidizing the top surface of the substrate in an electrolyte solution. The oxidizing proceeds selectively in the top surface in a pattern corresponding to an arrangement of an anode which is formed separately from the substrate and is held in contact with the bottom surface of the substrate, leaving oxidized portions partially in the top surface of the substrate. Thereafter, the oxidized portions are removed to leave a convex in the top surface of the substrate. This technique is sufficient for forming a relatively thin profile or surface irregularity with a small depth. However, it is found practically difficult to provide a thick profile with a smoothly curved surface as is required in many application fields, since the oxidized portions act as a dielectric barrier blocking an anodizing current through the substrate to inhibit the growth of the oxidized portions in the thickness of the substrate. Accordingly, in order to obtain the thick profile with an accurately designed curved contour, it has to be required not only to repeat steps of anodizing the top surface to partially form the oxidized portions followed by removing the oxidized portions, but also to use differently arranged anodes in each step. In this sense, the above prior art is found not to be available for providing a curved surface having sufficient depth or thickness.

Another prior art is disclosed in Japanese patent publication No. 2000-263556 which is directed to a process of making a mold for a micro optical lens. The mold is fabricated by steps of preparing a semiconductor substrate, providing a dielectric mask on a top surface of the substrate, forming one or more openings in the mask, placing the substrate in an electrolytic solution, and anodizing a portion in the top surface not covered by the mask to convert the portion into a porous zone. Thereafter, the porous zone is removed to leave a rounded convex in the top surface of the substrate. An ultraviolet curable resin is placed in the convex and is cured therein to obtain a convex lens. Although the prior art discloses the formation of the porous zones which does not impede the anodization, the process relies upon the mask with the opening so that the porous zone develops isotropically from the center of each opening. Accordingly, the resulting rounded convex is limited to have substantially a uniform radius of curvature. With this limitation, the process cannot be not adapted to realizing a curved profile having non-uniform radius of curvature or sophisticated surface profile.

Further, when forming a small curved surface configuration by use of the mask with tiny opening, the porous layer can be formed successfully around the tiny opening at an initial stage. However, bubbles appearing in the initial stage are difficult to escape out through the tiny opening and are likely to remain in the porous zones, which inhibits the entry of the electrolyte solution in the substrate and therefore impedes further development of the porous zone. With this result, the porous zones could not be controlled to give an intended predetermined profile, failing to reproduce the accurate profile. When, on the other hand, forming a relatively large surface profile with the use of the mask having a correspondingly large opening, it is likely that the anodization proceeds in the center of the opening at a rate considerably faster than at the periphery of the opening and the rate is difficult to be controlled. Therefore, it is difficult to give an accurately controlled surface profile to the porous zone and the resulting curved surface.

Moreover, because of that the mask is deposited on the side of the substrate from which the anodization proceeds, and the that the mask is normally made of SiN or the like having a relatively small thickness, for example, 1 μm or less, the mask may be easily broken due to a stress developing as the porous zone grows. Also in this respect, the process relying upon the mask on the anodization side of the substrate is not found satisfactory in providing the accurately controlled surface profile.

SUMMARY OF THE INVENTION

In view of the above problem, the present invention has been accomplished to provide an improved process of forming a curved profile on a semiconductor substrate. The process according to the present invention utilizes the semiconductor substrate having a top surface and a bottom surface opposed to each other, and includes the steps of forming an anode on the bottom surface, placing the semiconductor substrate in an electrolyte solution. Then, the steps are followed by flowing a current between the anode and a cathode within the solution to convert the top surface of the substrate to a varying depth from portions to portions, leaving a resulting porous layer in the top surface, and removing the porous layer from the substrate to leave a curved surface on the top surface. The process is characterized in that the anode is deposited and on the bottom surface to give a consolidated structure, and is configured to give a predetermined distribution of a electric field intensity which varies from portion to portions of the substrate across the top and bottom surfaces of the substrate, thereby providing the porous layer having the varying depth in match with the distribution of the electric field intensity and that the anode is removed from the substrate after forming the porous layer. With the above process, the anode is made integral with the substrate so as to accurately give the distribution of the electric field intensity in exact concordance with a pattern of the anode, thereby making it possible to precisely shape the porous layer and therefore the resulting curved surface. In addition, since the anode is configured to give the predetermined distribution of the electric field intensity varying from portions to portions of the substrate, it is easy to give continuously varying radius of curvature to the resulting curved surface.

Further, because of that the anodization proceeds from the top surface of the substrate which is exposed entirely to the electrolyte solution, i.e., not covered or masked by a material restricting the anodization, and that the anodization rate is controlled principally by the anode pattern on the bottom surface of the substrate, it is easy to develop the porous layer of accurately controlled contour or profile and therefore give the correspondingly accurate curved surface profile.

Accordingly, the process can be best utilized to forming curved surface of non-uniform radius of curvature, such as an non-spherical optical lens and various sophisticated microstructures having precisely controlled curved profile.

In one version of the present invention, the anode is formed partially on the bottom surface of the substrate to give a predetermined anode pattern which defines the predetermined distribution of the electric field intensity, and is responsible for realizing the curved surface having a concave profile at a portion opposed to the anode pattern. Therefore, it is easy to fabricate a concave profile of desired radius of curvature by suitably designing the anode pattern.

In another version of the present invention, the anode is deposited on the bottom surface of the substrate to have one or more openings of various geometries. The opening in the anode makes the distribution of the electric field intensity which is looser towards the center of the opening than from the periphery of the opening, thereby forming the porous layer of gradually varying thickness and giving a convex profile to the top surface at a potion opposed to the circular opening by removing the porous layer.

Instead of making the opening in the anode, a dielectric mask of predefined geometry may be formed partially on the bottom surface behind the anode so as to make the like distribution of the electric field intensity for giving a convex profile to the top surface at a portion opposed to the mask. The mask may be formed by the steps of providing a dielectric layer on the entire bottom surface of the; and removing a portion of the dielectric layer to leave the mask of desired geometry.

The semiconductor substrate is preferably made of silicon, and the dielectric layer is made of silicon oxide or silicon nitride. Also, the electrolyte solution is preferred to include an aqueous solution of hydrogen fluoride.

Further, the present invention is advantageous in fabricating a double-sided curved profile, for example, double-convex, double-concave, concavo-convex lenses. In this case, an additional anode is formed on the top surface of the substrate already finished with the curved surface. Then, the semiconductor substrate is placed in the electrolyte solution so as to flow a current between the additional anode and the cathode, thus converting the bottom surface of the substrate to a varying depth fro portions to portions, and consequently developing an additional porous layer in the bottom surface. The additional porous layer is removed together with the additional anode to reveal another curved surface on the bottom surface.

Moreover, it is preferably to decrease the current in the final stage of developing the porous layer so as to give a smooth finish to the curved surface.

These and still other advantageous features of the present invention will become more apparent from the following detailed explanation when taking in conjunction with the attached drawings.

DESCRIPTION OF EXEMPLARY EMBODIMENTS

Referring to FIGS. 1 to 5, there is shown a process of forming a curved profile on a semiconductor substrate in accordance with a first embodiment of the present invention which is adapted in use for fabrication of a plano-convex lens. The present invention is not limited to the fabrication of the lens, and can be applied to develop various curved surfaces on the surface of the semiconductor substrate for fabrication of MEMS (Micro Electro Mechanical Systems) or the like micro structures.

Figure 1:
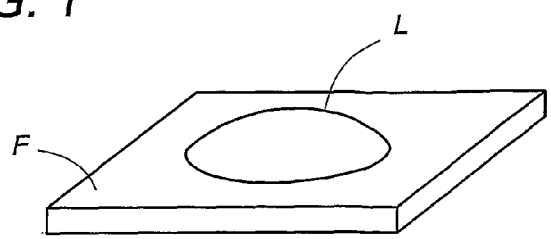
FIG. 1 is a perspective view of a plano-convex lens fabricated in accordance with a first embodiment of the present invention.
Figure 3:
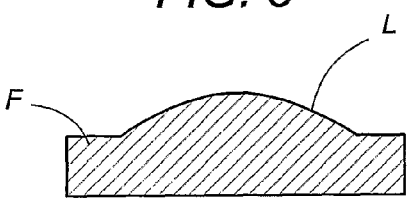
FIG. 3 is a sectional view of the lens.
Figure 2:
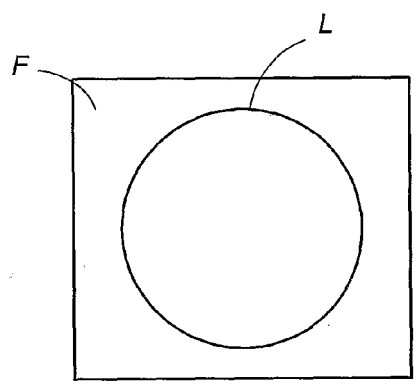
FIG. 2 is a top view of the lens.
Figure 4:
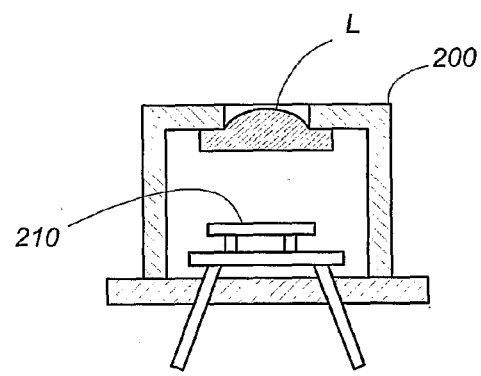
FIG. 4 is a sectional view illustrating a device in which the above lens is utilized.

As shown in FIGS. 1 to 3, the lens L is configured to have an integral flange F which is utilized for mounting the lens in a device such as an optical sensor 200, which is one typical application of the lens and is configured to have a sensing element such as a pyroelectric element 210 to receive the light through the lens, as shown in FIG. 4.

Figure 5:
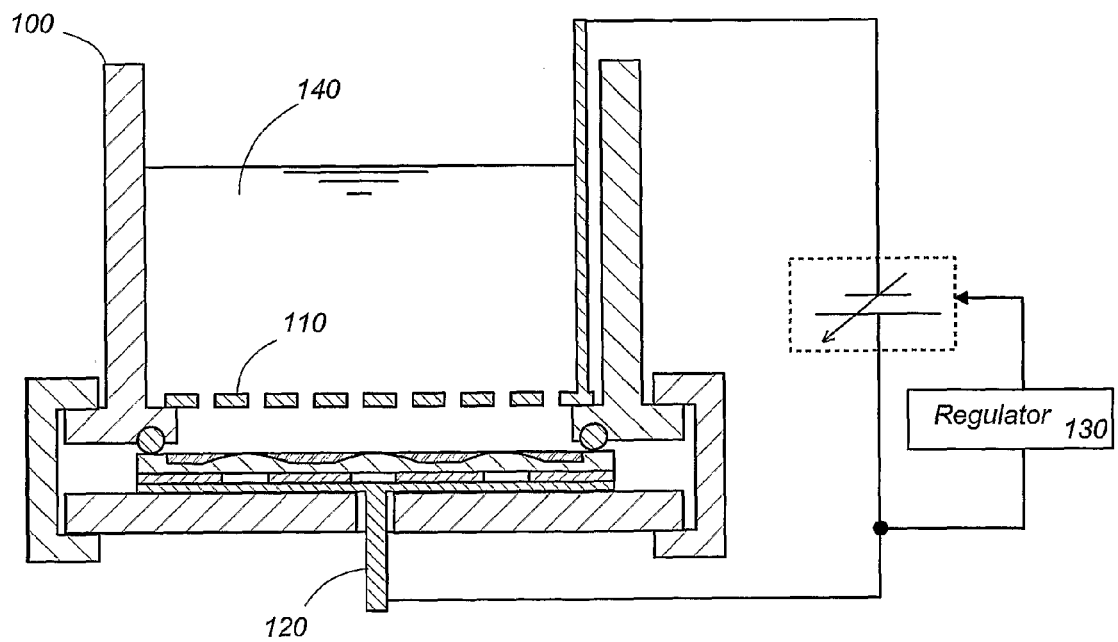
FIG. 5 is a sectional view of an anodizing apparatus utilized for making the process of the present invention.

The lens is made from a semiconductor material such as, silicon (Si), germanium (Ge), silicon carbide (SiC), gallium arsenide (GaAs), gallium phosphide (GaP), and indium phosphide (InP). In this embodiment, the semiconductor substrate 10 of p-type Si is utilized to fabricate the plano-convex lens by selective anodization of the substrate. The anodization is made by use of an anodizing apparatus 100 which, as shown in FIG. 5, is configured to place the substrate 10 within a volume of an electrolyte solution 140, and which is configured to be equipped with a regulator 130 for regulation of an electric current flowing between an anodic electrode 120 and a cathode 110 immersed in the solution. The anodic electrode 120 is held in contact with the bottom surface of substrate 10 in order to advance the anodization to a varying extent in the top surface opposed to the cathode 110. The anodic electrode 120 and cathodes 110 are both made of platinum.

Figure 6A:
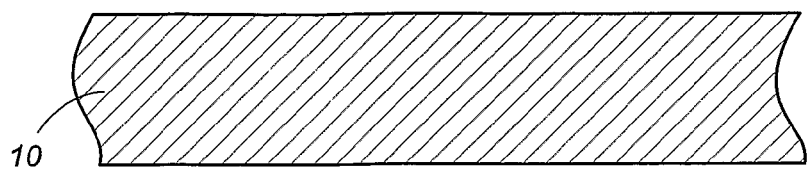
FIGS. 6A to 6E are sectional views illustrating the steps of forming the lens.
Figure 6B:
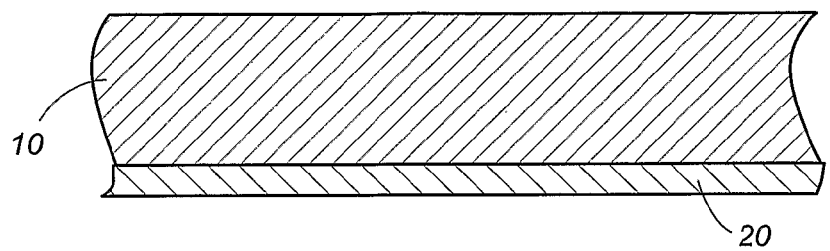
Figure 6C:
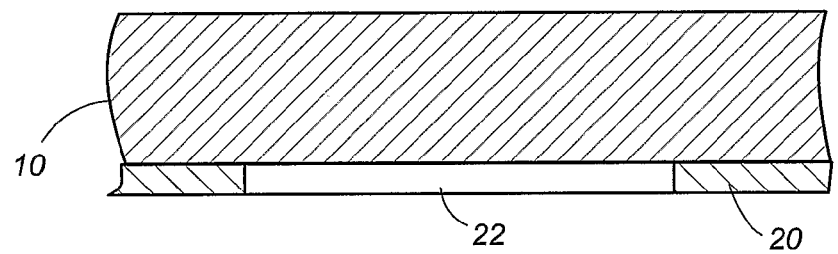
Figure 6D:
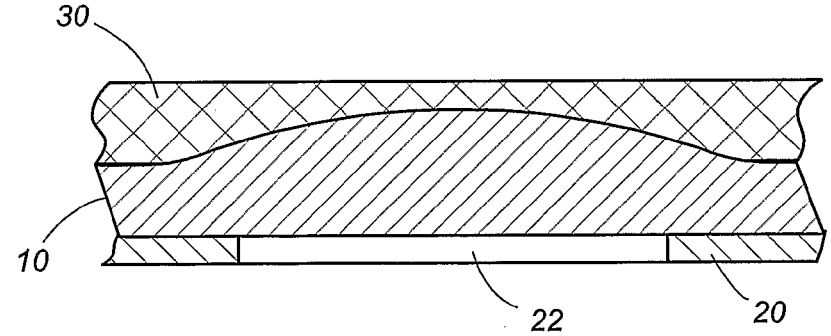
Figure 6E:
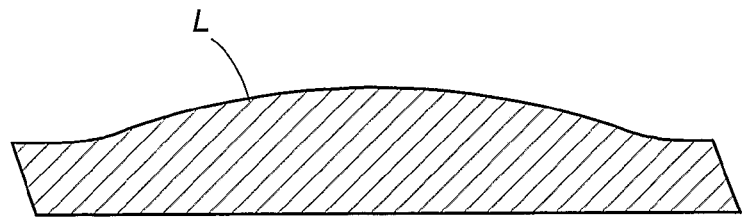

In this embodiment, the substrate 10 is selected to have a low resistance of several ohm centimeters (Ω·cm) to several hundreds ohm centimeters (Ω·cm). For example, a 0.5 mm thick flat p-type Si substrate 10 of 80 Ω·cm is shaped into the lens through the steps of FIGS. 6A to 6E. After being washed and cleaned, the substrate 10 is processed to have an electrically conductive layer 20 on the entire bottom surface (FIG. 6B). The conductive layer 20 is made of aluminum, for example, and is deposited by spattering or like technique on the substrate 10 to have a uniform thickness of 1 μm. Then, the layer 20 is etched to leave a circular opening 22 of 2 mm diameter to match a diameter of the lens to be fabricated to provide a consolidated structure in which the conductive layer 20 defines an anode pattern integrated to the substrate 10 (FIG. 6C). Subsequently, the substrate 10 is immersed within the electrolyte solution 140 in the anodizing apparatus 100 with the conductive layer 20 or the anode pattern in contact with the anodic electrode 120 and is followed by receiving an electric current flowing between the anode pattern and the cathode 110 so as to anodize the top surface of the substrate selectively in correspondence to the anode pattern, thereby developing a porous layer 30 in the top surface of the substrate 10 (FIG. 6D). The electric current is regulated by the regulator 130 to have a predetermined current density of 30 mA/cm$^2$, for example, and continue for a predetermined period of 120 minutes, for example. Thereafter, the porous layer 30 and the conductive layer 20 are etched out to obtain the lens (FIG. 6E).

The electrolyte solution utilized is an aqueous solution of hydrogen fluoride (HF) and ethanol mixed in a suitable ratio. In the anodization process, the following chemical reactions take place:

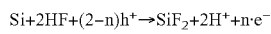

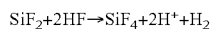

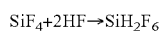

where h$^+$ denotes a hole and e$^-$ denotes an electron.

As soon as the Si substrate 10 is anodically oxidized, the oxidized portion is removed by reaction with the electrolyte solution so as to leave the porous layer 30 in the surface of the substrate 10. Accordingly, the anodization proceeds without being retarded by the oxidized portion, which makes it possible to develop the porous layer 30 having a greater depth, and therefore enable to fabricate the lens of relatively great thickness, i.e., the curved profile of considerable depth.

Figure 7A:
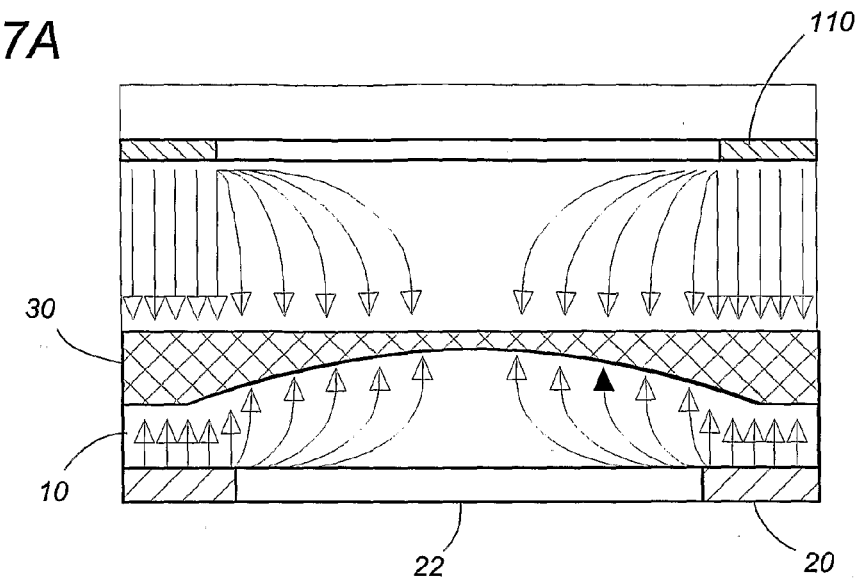
FIGS. 7A and 7B are schematic views illustrating electric field intensity distribution developed in the process of forming the lens.

As schematically shown in FIG. 7A, an in-plane electric field strength or current density is variably distributed in coincidence with the anode pattern. In the figure, the lines with black arrows indicate paths of the positive current flowing through the substrate 10, while the lines with white arrows indicate the paths of the electrons flowing through the substrate 10. Since the in-plane current density becomes denser towards the periphery of the opening 22 than at the center of the opening, the resulting porous layer 30 has a continuously varying depth which is greater towards the periphery of opening 22 than at the center of the opening. Consequently, the plano-convex lens is obtained by removal of the porous layer 30 and the anode pattern or the conductive layer 20. The distribution of the in-plane electric field strength will be determined primarily by the anode pattern, and secondarily by the resistivity and the thickness of the substrate 10, resistance of the electrolyte solution 140, a distance between the substrate 10 and the cathode 110, and a planar configuration of the cathode 110 (i.e. cathode arrangement in a plane parallel to the substrate). Accordingly, it is readily possible to give any desired surface profile by suitably selecting these parameters in combination with the anode pattern. It should be noted here that since the anodization proceeds to develop the porous layer continuously without being retarded by otherwise appearing oxidized portions in the substrate, the thick lens or thick curved profile can be easily fabricated in a single anodization process, which enhances flexibility of the curved surface design.

Figure 7B:
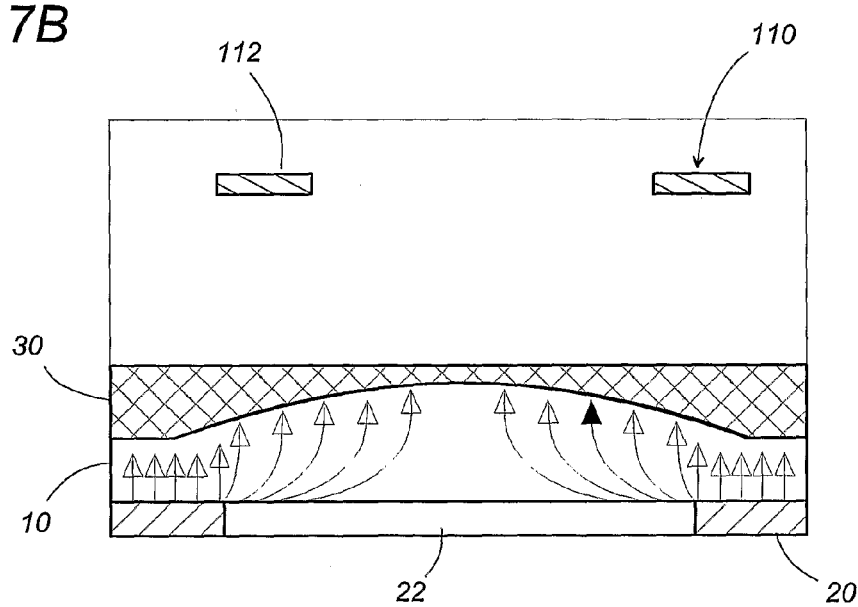

The resistance of the electrolytic solution can be adjusted by the concentration of the aqueous solution of hydrogen fluoride (HF) and/or by a mixing ratio of HF to ethanol. The cathode 110 may be designed to have a pattern in exact coincident with the anode pattern as shown in FIG. 7A, or to have a pattern in which the opposing cathode elements 112 are offset slightly towards the center of the opening 22 of the anode pattern in a plane parallel to the substrate 10, as shown in FIG. 7B. The offset amount can be adjusted in relation with the current density as well as the distance to the substrate 10.

In the anodization process, the regulator 130 acts to keep the current density at a constant level. However, it is preferably to decrease the current density gradually in a final stage of the anodization process in order to correspondingly decrease the rate of developing the porous layer 30. With this technique, the resulting lens can have a more smooth surface finish. The regulation of the current density is made by monitoring the current level or voltage level.

The removal of the porous layer 30 and the conductive layer 20 can be made by use of an alkali solution such as KOH, NaOH and TMAH (tetramethyl ammonium hydrooxide) or HF solution.

EXAMPLE

Figure 8:
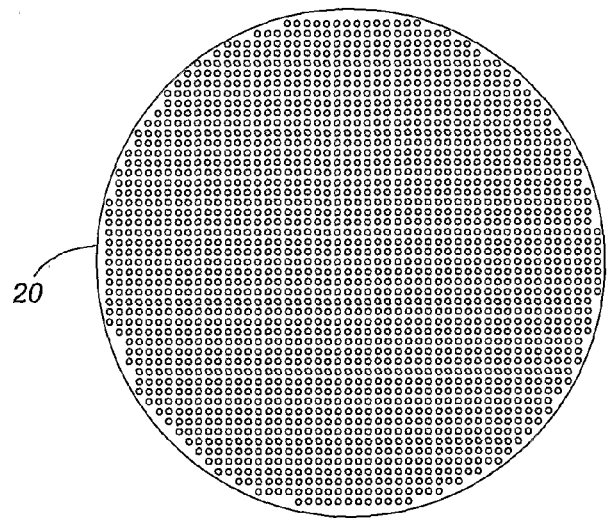
FIG. 8 illustrates an anode pattern formed on the bottom surface of the substrate.
Figure 9:
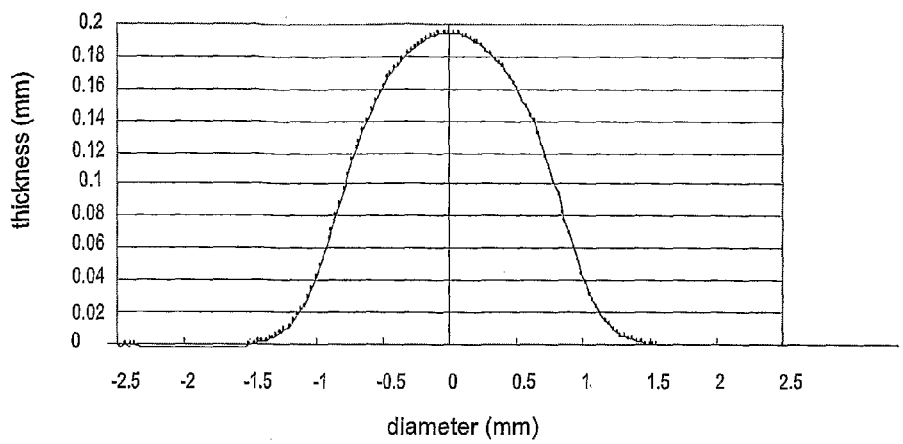
FIG. 9 is a graph illustrating a sectional surface profile of the lens fabricated in accordance with an example of the above embodiment.

A 100 mm diameter p-type Si substrate 10 of 0.5 mm thick and 80 Ω·cm resistivity was formed on its bottom surface with a 1 μm thick aluminum conductive layer 20 by spattering. After sintering the conductive layer 20 at 420° C. for 20 minutes, the layer 20 was masked by photolithography with a resist pattern having a plurality of windows of 2 mm diameter. Then, the unmasked portion of the conductive layer 20 was etched out to form a plurality of 2 mm diameter openings in the conductive layer, as shown in FIG. 8. After being removed of the resist pattern, the substrate 10 was placed in the anodizing apparatus of FIG. 5 containing the electrolytic solution comprised of an 1:1 ratio mixture of a 50% aqueous solution of hydrogen fluoride (HF) and ethanol. Then, the substrate was anodized at current density of 30 mA/cm$^2$ for 3 hours. The resulting porous layer 30 was found to have a 0.3 mm thick at the portion corresponding to the conductive layer 20 and to have a decreasing thickness towards the center of the opening 22 in a plane parallel to the substrate. The porous layer 30 and the conductive layer 20 are then etched out by a 10% aqueous solution of KOH over a period of 15 minutes, thereby forming a plurality of plano-convex lenses. The substrate 10 was then cut out into a plurality of the lens. The etching rate of removing the porous layer 30 was more than 10 times than that of removing the substrate 10. Accordingly, only the porous layer 30 was selectively etched out while keeping the substrate intact. Thus formed lens were each configured to have a lens thickness of 0.195 mm with a profile shown in FIG. 9.

Figure 10:
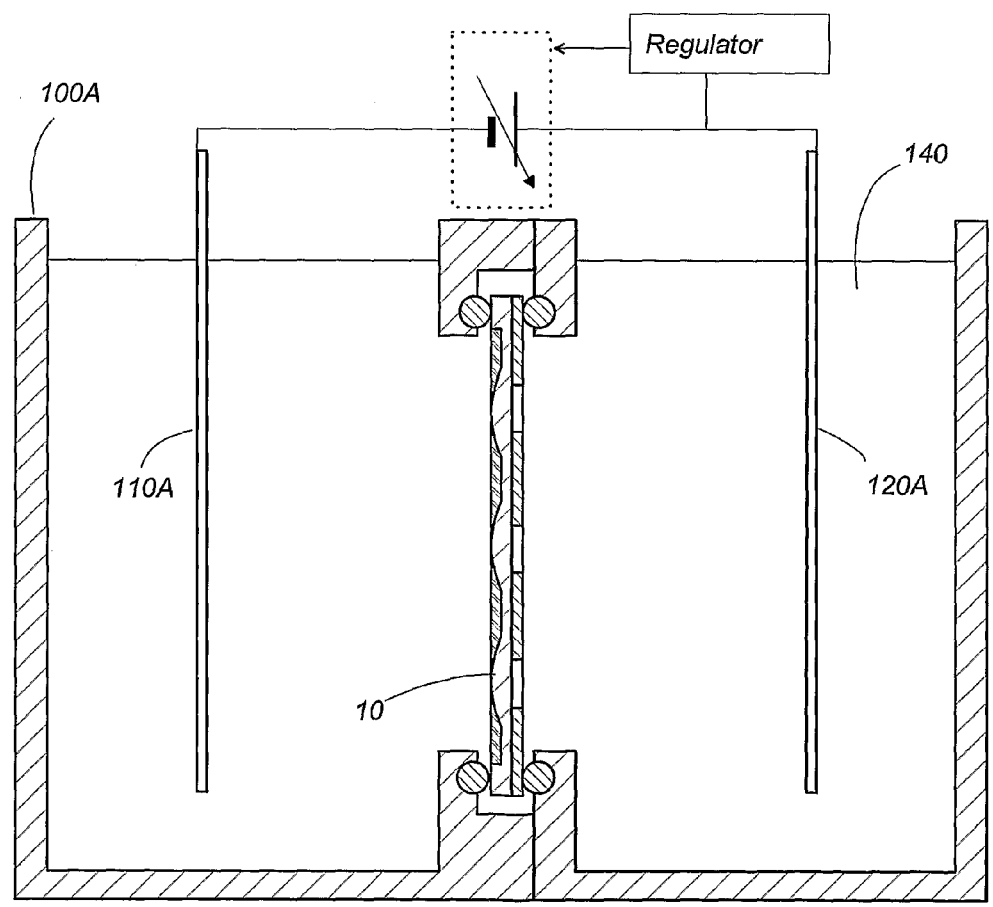
FIG. 10 is a section of another anodizing apparatus which is utilized for making the process of the present invention.

FIG. 10 illustrates another anodizing apparatus 100A which is equally utilized for fabrication of the lens. The apparatus 100A is basically identical with that of FIG. 5 except that the substrate 10 is disposed centrally within the electrolytic solution 140, and that the cathode 110A and the anodic electrode 120A are disposed on the opposite sides of the vertically supported substrate 10.

Second Embodiment

Figure 11:
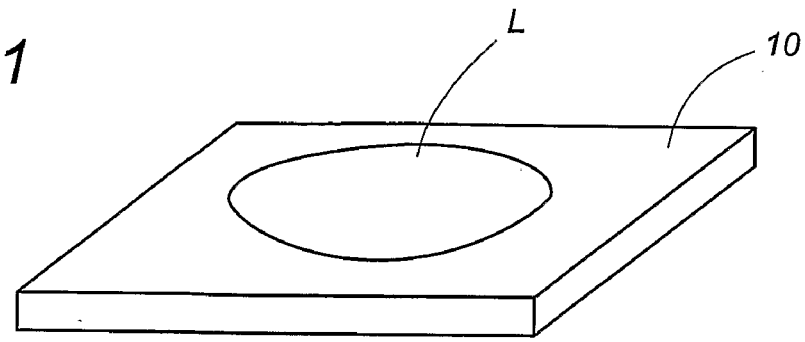
FIG. 11 is a perspective view of a plano-concave lens fabricated in accordance with a second embodiment of the present invention.
Figure 12A:
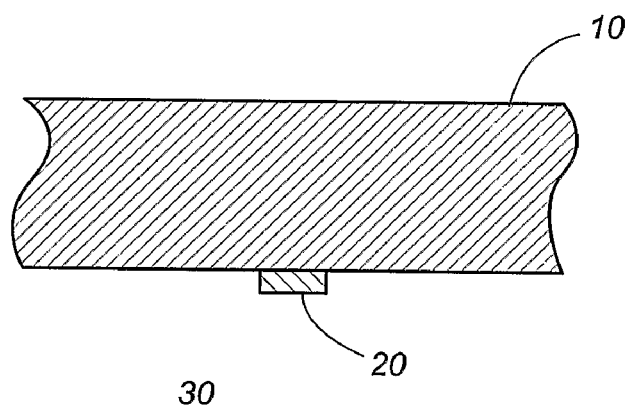
FIG. 12A to 12C are sectional views illustrating the steps of forming the lens.
Figure 12B:
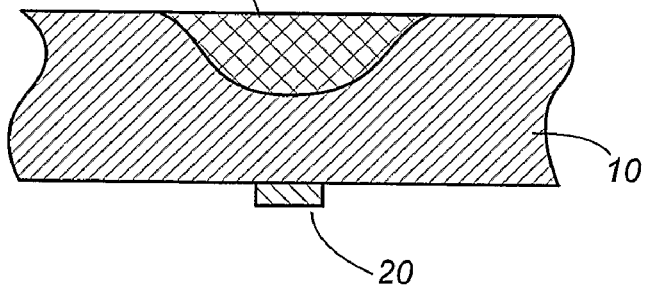
Figure 12C:
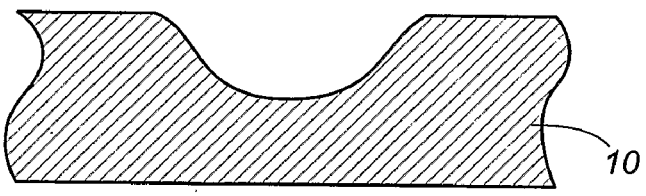
Figure 13A:
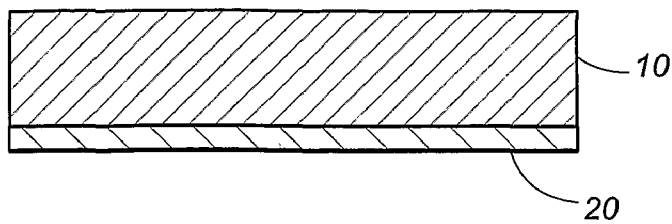
FIG. 13A to 13G are sectional views illustrating the steps of forming a double-convex lens in accordance with a third embodiment of the present invention.
Figure 13B:
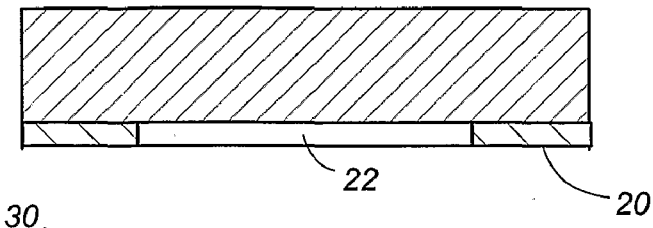
Figure 13C:
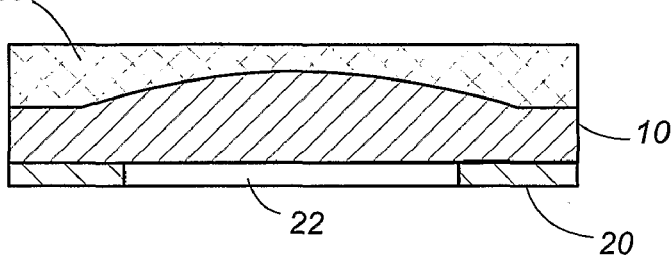
Figure 13D:
Figure 13E:
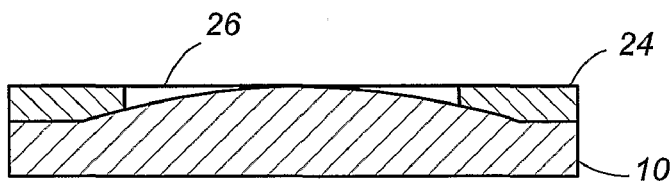
Figure 13F:
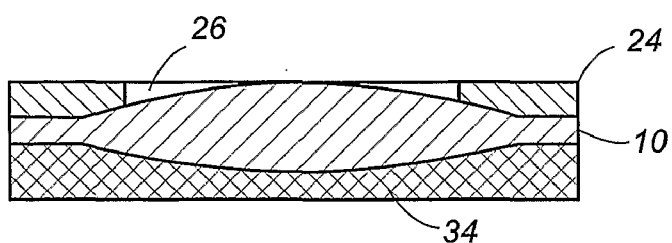
Figure 13G:
Figure 14A:
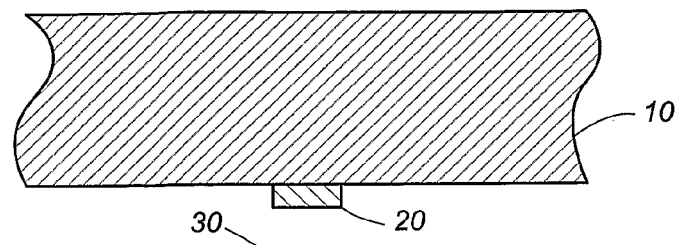
FIG. 14A to 14F are sectional views illustrating the steps of forming a double-concave lens in accordance with a fourth embodiment of the present invention.
Figure 14B:
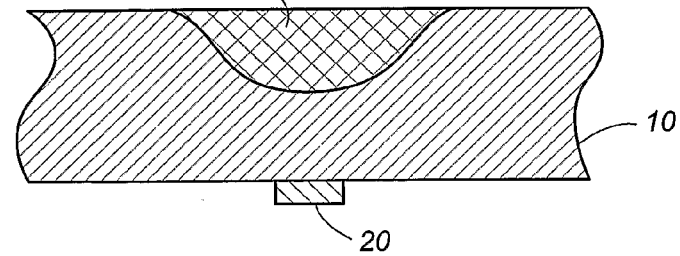
Figure 14C:
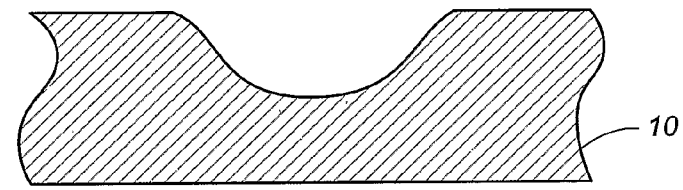
Figure 14D:
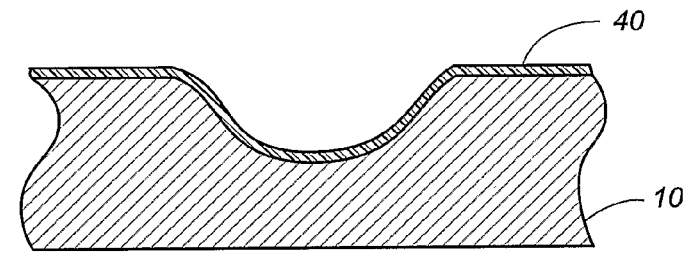
Figure 14E:
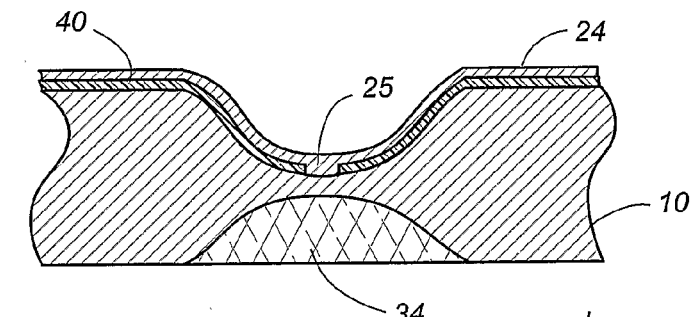
Figure 14F:
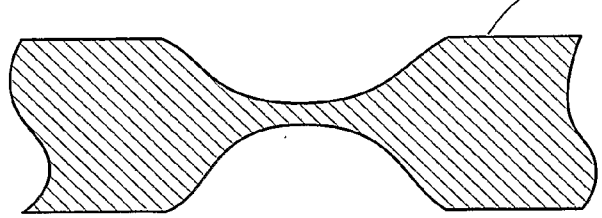
Figure 15A:
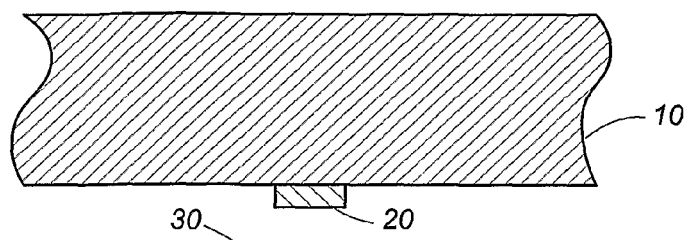
FIG. 15A to 15F are sectional views illustrating the steps of forming a concavo-convex lens in accordance with a fifth embodiment of the present invention.
Figure 15B:
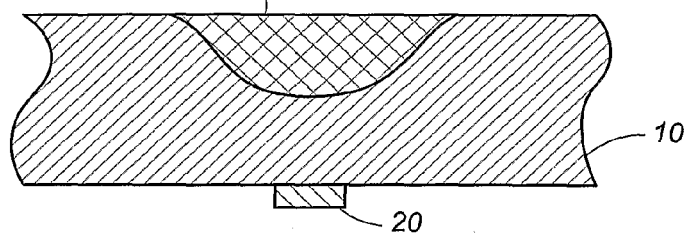
Figure 15C:
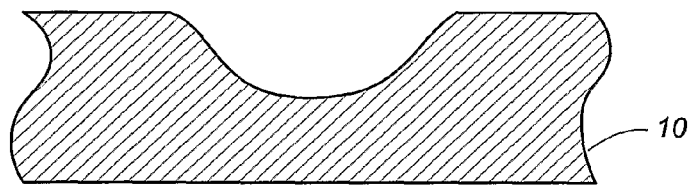
Figure 15D:
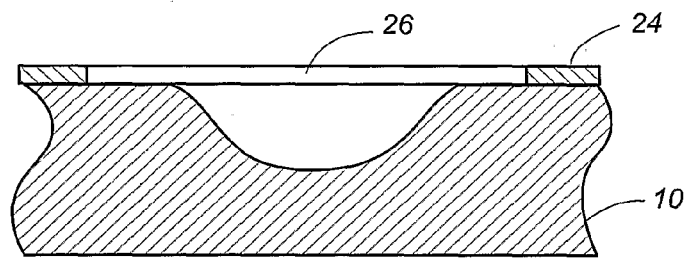
Figure 15E:
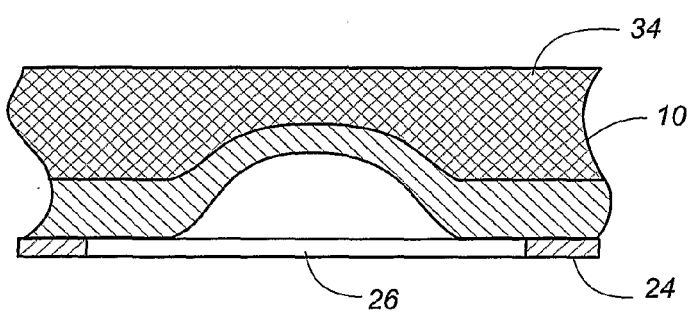
Figure 15F:
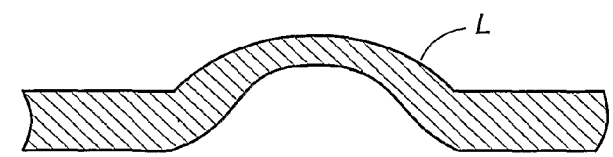
Figure 16A:
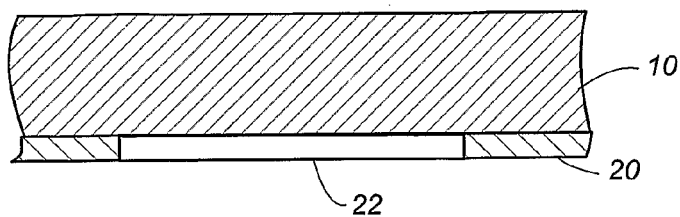
FIG. 16A to 16E are sectional views illustrating the steps of forming a concavo-convex lens in accordance with a sixth embodiment of the present invention.
Figure 16B:
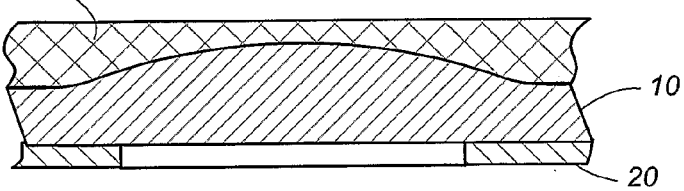
Figure 16C:
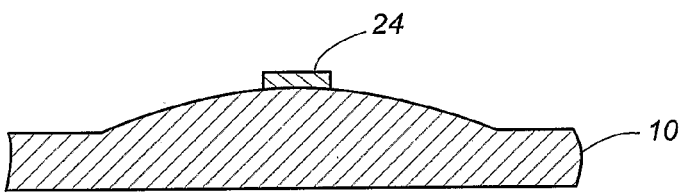
Figure 16D:
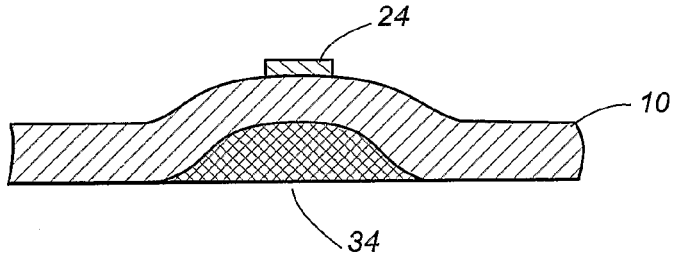
Figure 16E:
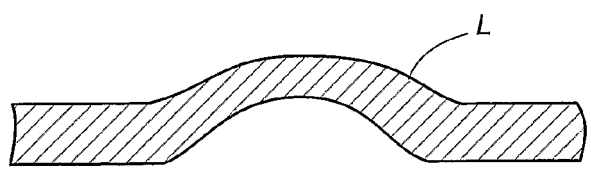

FIGS. 11 and 12 illustrate the process of fabricating a plano-concave lens L in accordance with the second embodiment of the present invention. In the present invention, the semiconductor substrate 10 is formed on its bottom surface with an anode pattern composed of a plurality of circular anodes 20 in a pattern analogous to that shown in FIG. 8. For simplicity, only single anode 20 is shown in FIGS. 12A and 12B. Each anode 20 is responsible for forming a concave profile in the opposing top surface of the substrate 10 by anodization and by removal of the resulting porous layers 30 in the like manner as discussed with reference to the first embodiment. That is, during the anodizing process, the porous layer 30 develops in the top surface at a portion opposed to each anode 20 to have a depth which is greater towards the center of each electrode 20 than at the periphery thereof, as shown in FIG. 12B. Then, the porous layer 30 and the anode 20 are etched out to uncover the concave profile in the top surface of the substrate 10, as shown in FIG. 12C. Thereafter, the substrate 10 is cut out into individual pieces of the plano-convex lenses.

Third Embodiment

FIG. 13 illustrates the process of fabricating a double-convex lens L in accordance with the third embodiment of the present invention which is similar to the first embodiment except for inclusion of additional anodization process. Firstly, the substrate 10 is formed in its top surface with the convex profile through the steps as described in the first embodiment and as shown in FIGS. 13A to 13D. Then, an additional conductive layer 24 with a plurality of additional circular openings 26 is deposited on the top surface with each of the additional circular openings 26 being disposed in concentric with the already formed convex profile as shown in FIG. 13E, in which only one additional circular opening 26 is shown for simplicity. Subsequently, the substrate 10 is anodized to develop an additional porous layer 34 in the bottom surface of the substrate 10, as shown in FIG. 13F. The additional porous layer 34 is etched out together with the additional conductive layer 24 to obtain the double-convex lens L, as shown in FIG. 13G. In this manner, the double convex lens can be obtained simply by adding another anodization process.

Fourth Embodiment

FIG. 14 illustrates the process of fabricating a double-concavo lens L in accordance with the fourth embodiment of the present invention which is similar to the second embodiment except for adding another anodization process. As shown in FIGS. 14A to 14C, the substrate 10 is formed with a plurality of concave profiles (only one being shown for simplicity) in the top surface by the process described in the second embodiment. Then, as shown in FIG. 14D, the entire top surface of the substrate 10 is covered by a dielectric mask 40 of a suitable thickness, for example, 200 nm by known film forming technique such as CVD (chemical vapor deposition). The mask 40 may be made of a material selected from a group consisting of $SiO_2$, SiN, and SiC. Thereafter, the mask 40 is etched in the center of each concave profile to leave an opening thereat. An additional conductive layer 24 of aluminum is then deposited over the entire mask 40 to provide a center anode 25 in the opening of the mask for direct contact with the center of each concave profile, as shown in FIG. 14E. Subsequently, the substrate 10 is anodized to develop an additional porous layer 34 in the bottom surface which is concentric with the center anode 25. Finally, the additional porous layer 34 is etched out together with the conductive layer 24 and the mask 40 to obtain the double-concavo lenses L which are cut into the individual pieces, as shown in FIG. 14F.

Fifth Embodiment

FIG. 15 illustrates the process of fabricating a concavo-convex lens in accordance with the fifth embodiment of the present invention which is similar to the first and second embodiments except for making the anodization twice to develop the porous layers in the top and bottom surfaces. As shown in FIGS. 15A to 15C, the substrate 10 is formed with a plurality of concave profiles (only one being shown for simplicity) in the top surface of the substrate 10 in much the same manner as in the second embodiment. Then, an additional conductive layer 24 is deposited on the top surface of the substrate 10 followed by being etched to leave a plurality of additional circular opening 26 each in concentric with the already formed concave profile, as shown in FIG. 15D. Each opening 26 is dimensioned to have a diameter slightly greater than that of the corresponding concave profile. Subsequently, the substrate 10 is anodized to develop an additional porous layer in the bottom surface each in correspondence with each concave profile, as shown in FIG. 15E, after which the additional layers 34 are etched out together with the additional conductive layer 24 to give the final structure of the concavo-convex profile as shown in FIG. 15F.

Sixth Embodiment

FIG. 16 illustrates an alternative process of fabricating a concavo-convex lens in accordance with the sixth embodiment of the present invention which is similar to the fifth embodiment except for the order of the anodization processes. As shown in FIGS. 16A to 16C, the substrate 10 is formed with a plurality of convex profiles (only one being shown for simplicity) in the top surface of the substrate 10 in much the same manner as in the first embodiment. Then, an additional conductive layer 24 is deposited on top of each convex profile as shown in FIG. 16C. Each additional layer 24 is dimensioned to have a diameter less than that of each corresponding convex profile and is responsible for developing an additional porous layer 34 concentric with the convex profile in the anodization, as shown in FIG. 16D. Each of the resulting additional porous layers 34 is etched out together with the additional conductive layers 24 to give a final structure of the concavo-convex profile as shown in FIG. 16E.

Figure 17:
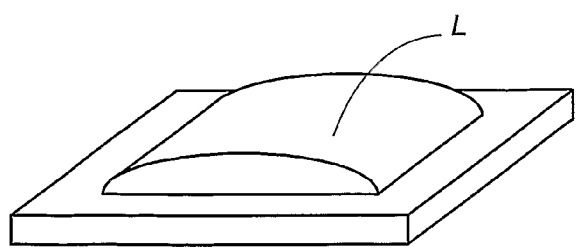
FIG. 17 is a perspective view illustrating a non-circular lens which can be fabricated in accordance with the present invention.

FIG. 17 illustrates a cylindrical lens L which can be equally fabricated in accordance with the present invention. When making such non-circular lens, the opening in the conductive layer or the mask covered by the conductive layer is shaped to be rectangular in a plane parallel to the surface of the substrate.

Seventh Embodiment

Figure 18A:
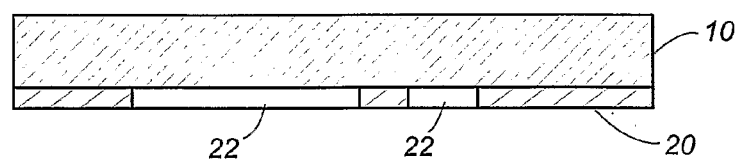
FIGS. 18A to 18C are sectional views illustrating the steps of forming a curved profile in accordance with a seventh embodiment of the present invention.
Figure 18B:
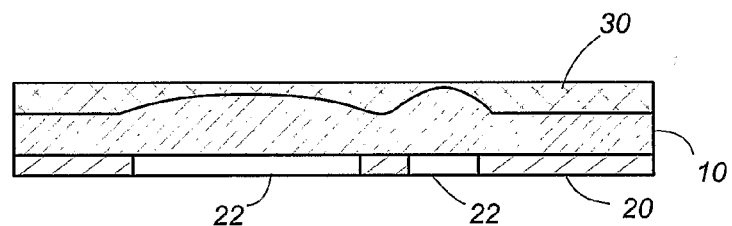
Figure 18C:
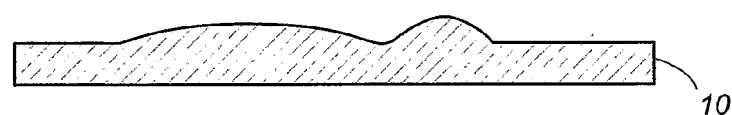

FIG. 18 illustrates another process of forming a curved surface on the substrate 10 in accordance with the seventh embodiment of the present invention which is similar to the first embodiment except for the formation of a curved surface which is a combination of convexes of different sizes. A conductive layer 20 of Al is deposited on the bottom surface of the substrate 10 and is etched to have openings 22 of different dimensions, giving an anode pattern consolidated to the substrate 10 (FIG. 18A). Then, the substrate 10 is anodized to develop a porous layer 30 in the top surface (FIG. 18B). The resulting porous layer 30 has a continuously varying depth at portions respectively opposed to the openings 22. Subsequently, the porous layer 30 and the conductive layer 20 are etched out to give the substrate 10 finished with the curved surface (FIG. 18C).

Figure 19:
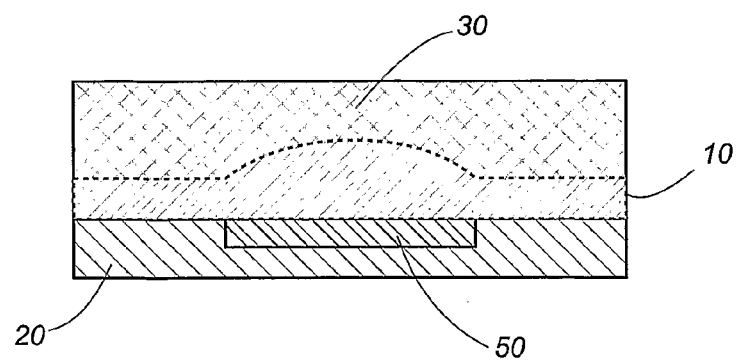
FIG. 19 is a sectional view illustrating the step of using a dielectric mask for fabrication of a convex lens in accordance with a modification of the above embodiment.

Although the convex profile is explained to be formed by use of the conductive layer with a circular opening in the above embodiment, the present invention should be interpreted not to be limited thereto but to encompass a scheme of using a dielectric mask 50 in combination with the conductive layer 20, as shown in FIG. 19. The dielectric mask 50 is deposited on the bottom surface of the substrate 10 partially at a portion corresponding to the intended convex profile, while the conductive layer 20 is deposited over the mask 50 to cover the surface of the substrate entirely, thereby achieving a distribution of varying electric filed intensity for developing the porous layer 30 of a configuration complementary to the convex profile in the anodizing process. The dielectric mask is selected from a group consisting of $SiO_2$, SiN, and SiC and is deposited on the substrate by know technique such as CVD or the like.

It should be noted here that the above embodiments and example are shown only for exemplarily purpose and the present invention can be utilized for providing various curved surface profile on the semiconductor substrate.

Further, the present invention should be interpreted to be not limited to

| Semiconductor material | Electrolytic solution | Masking material |
|---|---|---|
| Si | HF: $C_2H_5OH$ | SiN |
| Ge | HCl: $C_2H_5OH$ | $SiO_2$, SiN, SiC |
| SiC | HF: $C_2H_5OH$ | SiN |
| GaAs | HCl | $SiO_2$, SiN, SiC |
| GaP | $H_2SO_4$ | $SiO_2$, SiN, SiC |
| InP | HCl | $SiO_2$, SiN, SiC | the use of the silicon substrate but to allow the use of other semiconductor materials in combination with specific electrolyte solution as shown in the table below.

In the above table, the mask material available in combination of the semiconductor material and the electrolytic solution are listed.

The invention claimed is:

1. A process of forming a curved profile on a semiconductor substrate, said process comprising the steps of:
preparing said semiconductor substrate having a top surface and a bottom surface opposed to each other;
forming an anode on said bottom surface,
placing said semiconductor substrate in an electrolyte solution;
flowing a current between said anode and a cathode within said solution to convert the top surface of said substrate to a varying depth from portions to portions, leaving a porous layer in said top surface; and
removing said porous layer from said substrate to leave a curved surface on said top surface,
wherein
said anode is deposited on said bottom surface to provide a consolidated structure and is configured to provide a predetermined distribution of an electric field intensity which varies from portion to portions of said substrate across said to and bottom surfaces of said substrate, thereby providing said porous layer having the varying depth in order to match the distribution of said electric field intensity,
wherein
said anode is formed partially on said bottom surface of the semiconductor substrate to provide a predetermined anode pattern which defines said predetermined distribution of said electric field intensity, and
wherein
said anode pattern is formed by the steps of:
depositing an electrically conductive layer on the bottom surface of said substrate;
removing a portion of said conductive layer to form a corresponding opening in said conductive layer.

2. A process of forming a curved profile on a semiconductor substrate, said process comprising the steps of:
preparing said semiconductor substrate having a top surface and a bottom surface opposed to each other;
forming an anode on said bottom surface;
placing said semiconductor substrate in an electrolyte solution having a cathode;
flowing a current between said anode and said cathode to convert the top surface of said substrate to a varying depth from portions to portions, leaving a porous layer in said top surface; and
removing said porous layer from said substrate to leave a curved surface on said top surface,
wherein said anode is deposited on said bottom surface to provide a consolidated structure and is configured to provide a predetermined distribution of an electric field intensity which varies from portion to portions of said substrate across said top and bottom surfaces of said substrate, thereby providing said porous layer having the varying depth to match the distribution of said electric field intensity, and
wherein said anode is formed on the bottom surface of said semiconductor substrate over a dielectric mask which is formed partially on said bottom surface to realize said predetermined distribution of said electric field intensity.

3. The process as set forth in claim 2, wherein
said mask is formed by the steps of:
providing a dielectric layer on the entire bottom surface of said semiconductor substrate;
removing a portion of said dielectric layer to leave said mask on the bottom surface of said semiconductor substrate.

4. The process as set forth in claim 2, wherein
said semiconductor substrate is made of silicon, and said dielectric layer is made of silicon oxide or silicon nitride.

5. A process of forming a curved profile on a semiconductor substrate, said process comprising the steps of:
preparing said semiconductor substrate having a top surface and a bottom surface opposed to each other;
forming an anode on said bottom surface;
placing said semiconductor substrate in an electrolyte solution having a cathode;
flowing a current between said anode and said cathode to convert the top surface of said substrate to a varying depth from portions to portions, leaving a porous layer in said top surface; and
removing said porous layer from said substrate to leave a curved surface on said top surface,
wherein said anode is deposited on said bottom surface to provide a consolidated structure and is configured to provide a predetermined distribution of an electric field intensity which varies from portion to portions of said substrate across said top and bottom surfaces of said substrate, thereby providing said porous layer having the varying depth to match the distribution of said electric field intensity, said process further includes the steps of:

forming an additional anode partially on said top surface of said semiconductor substrate finished with said curved surface;

placing said semiconductor substrate in said electrolyte solution;

flowing a current between said additional anode and said cathode within said solution to convert the bottom surface of said substrate to a varying depth from portions to portions, leaving an additional porous layer in said bottom surface; and removing said additional porous layer and said additional anode from said substrate to leave another curved surface on said bottom surface.

6. A process of forming a curved profile on a semiconductor substrate, said process comprising the steps of:

preparing said semiconductor substrate having a top surface and a bottom surface opposed to each other;

forming an anode on said bottom surface;

placing said semiconductor substrate in an electrolyte solution having a cathode;

flowing a current between said anode and said cathode to convert the top surface of said substrate to a varying depth from portions to portions, leaving a porous layer in said top surface; and removing said porous layer from said substrate to leave a curved surface on said top surface, wherein said anode is deposited on said bottom surface to provide a consolidated structure and is configured to provide a predetermined distribution of an electric field intensity which varies from portion to portions of said substrate across said top and bottom surfaces of said substrate, thereby providing said porous layer having the varying depth to match the distribution of said electric field intensity, and wherein said current is regulated to decrease in a final stage of developing the porous layer.

7. The process as set forth in any one of claims 1, 2, 5 and 6, wherein said semiconductor substrate is made of silicon, and said electrolyte solution includes an aqueous solution of hydrogen fluoride.

8. The process as set forth in any one of claims 1, 2, 5 and 6, wherein said semiconductor substrate is made of a p-type semiconductor.

9. The process as set forth in any one of claims 1, 2, 5 and 6, wherein said substrate is selected to have a resistance of several ohm centimeters ($\Omega \cdot cm$) to several hundreds ohm centimeters ($\Omega \cdot cm$).

* * * * *